United States Patent
Kajiyama et al.

(10) Patent No.: US 9,263,666 B2
(45) Date of Patent: Feb. 16, 2016

(54) MAGNETIC RANDOM ACCESS MEMORY

(71) Applicant: KABUSHIKI KAISHA TOSHIBA, Minato-ku (JP)

(72) Inventors: Takeshi Kajiyama, Yokohama (JP); Yoshiaki Asao, Sagamihara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/563,374

(22) Filed: Dec. 8, 2014

(65) Prior Publication Data

US 2015/0137290 A1  May 21, 2015

Related U.S. Application Data

(62) Division of application No. 13/370,075, filed on Feb. 9, 2012, now Pat. No. 8,941,197, which is a division of application No. 12/037,425, filed on Feb. 26, 2008, now abandoned.

(30) Foreign Application Priority Data

Feb. 27, 2007 (JP) ................... 2007-047696

(51) Int. Cl.
| | |
|---|---|
| H01L 27/22 | (2006.01) |
| H01L 43/08 | (2006.01) |
| G11C 11/16 | (2006.01) |
| H01L 43/02 | (2006.01) |
| H01L 43/10 | (2006.01) |

(52) U.S. Cl.
CPC ............. *H01L 43/08* (2013.01); *G11C 11/16* (2013.01); *H01L 27/222* (2013.01); *H01L 43/02* (2013.01); *H01L 43/10* (2013.01)

(58) Field of Classification Search
CPC ............ H01L 27/228; H01L 2924/0002; H01L 43/02; H01L 43/08; H01L 2924/00
See application file for complete search history.

(56) References Cited

U.S. PATENT DOCUMENTS

| | | |
|---|---|---|
| 2003/0112655 A1 | 6/2003 | Hosotani |
| 2004/0195609 A1 | 10/2004 | Durcan et al. |
| 2006/0002184 A1 | 1/2006 | Hong et al. |

(Continued)

FOREIGN PATENT DOCUMENTS

| | | |
|---|---|---|
| JP | 2000-183296 | 6/2000 |
| JP | 2003-133527 | 5/2003 |
| JP | 2003-282837 | 10/2003 |

(Continued)

OTHER PUBLICATIONS

Japanese Office Action issued May 22, 2012, in Patent Application No. 2007-047696 (with English-language translation).

*Primary Examiner* — Tony Tran
(74) *Attorney, Agent, or Firm* — Oblon, McClelland, Maier & Neustadt, L.L.P.

(57) ABSTRACT

A magnetic random access memory which is a memory cell array including a magnetoresistive effect element having a fixed layer whose magnetization direction is fixed, a recording layer whose magnetization direction is reversible, and a non-magnetic layer provided between the fixed layer and the recording layer, wherein all conductive layers in the memory cell array arranged below the magnetoresistive effect element are formed of materials each containing an element selected from a group including W, Mo, Ta, Ti, Zr, Nb, Cr, Hf, V, Co, and Ni.

5 Claims, 8 Drawing Sheets

(56) References Cited

U.S. PATENT DOCUMENTS

| | | |
|---|---|---|
| 2006/0114714 A1 | 6/2006 | Kanegae |
| 2007/0063236 A1 | 3/2007 | Huai et al. |

FOREIGN PATENT DOCUMENTS

| | | |
|---|---|---|
| JP | 2004-214459 | 7/2004 |
| JP | 2004-228187 | 8/2004 |
| JP | 2006-190838 | 7/2006 |
| WO | WO 97/40528 | 10/1997 |

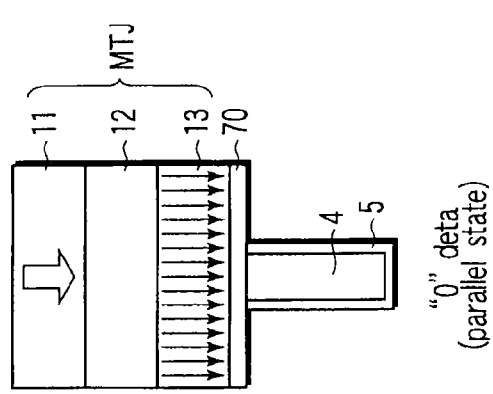
FIG. 9D "1" deta (anti-parallel state)
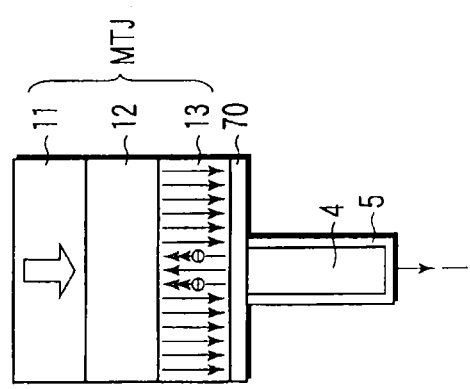
FIG. 9C
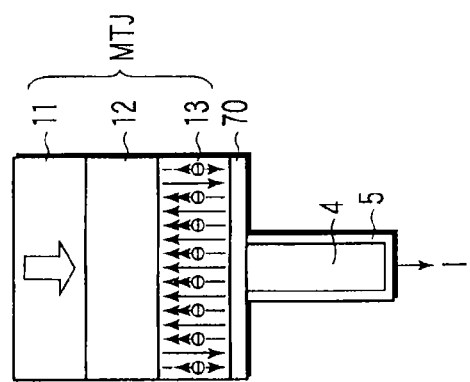
FIG. 9B
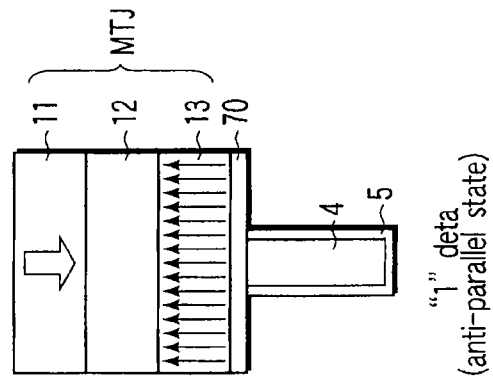
FIG. 9A "0" deta (parallel state)

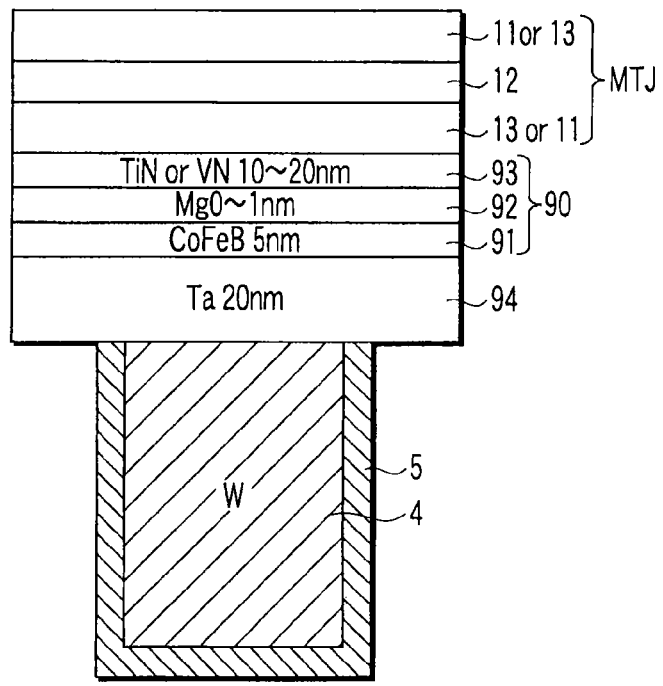
F I G. 12
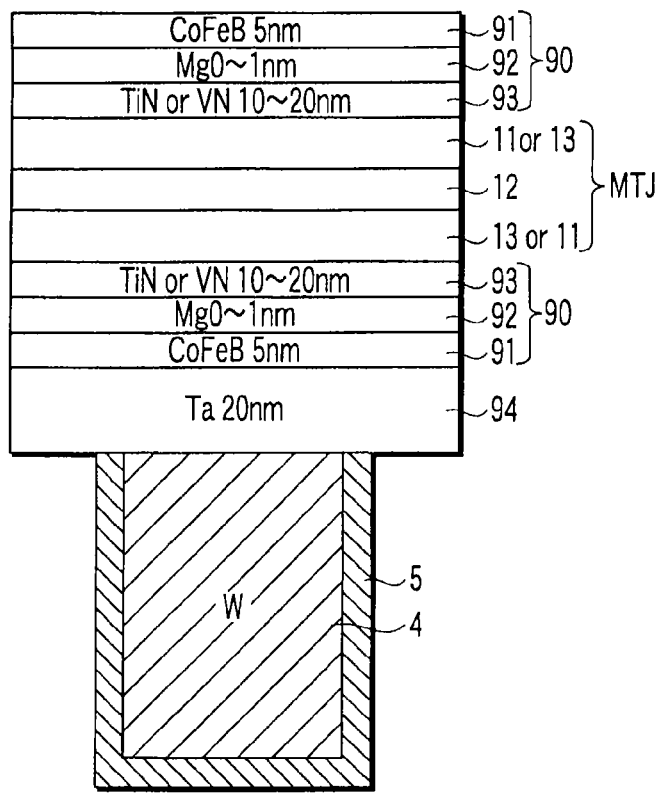
F I G. 13

MAGNETIC RANDOM ACCESS MEMORY

CROSS-REFERENCE TO RELATED APPLICATIONS

This application is a divisional of U.S. application Ser. No. 13/370,075, filed Feb. 9, 2012, which is a divisional of U.S. application Ser. No. 12/037,425, filed Feb. 26, 2008, and is based upon and claims the benefit of priority from prior Japanese Patent Application No. 2007-047696, filed Feb. 27, 2007, the entire contents of each of which are incorporated herein by reference.

BACKGROUND OF THE INVENTION

1. Field of the Invention

The present invention relates to a magnetic random access memory including conductive layers each formed of a refractory metal.

2. Description of the Related Art

In a spin injection magnetization reversal type magnetic random access memory (MRAM), annealing must be performed at a high temperature of 350° C. or above in order to improve crystallinity of MgO in a tunnel insulating film and thereby increase the magnetoresistive ratio. Further, in some expected magnetic materials, especially perpendicular magnetic materials, an annealing temperature of approximately 500 to 700° C. is required to improve characteristics.

However, in an interconnect structure assumed in a magnetic random access memory, a current is large in both current generation magnetic field writing and spin injection writing, and using an Al interconnect or a Cu interconnect has been conventionally premised. In such a structure, when high-temperature annealing at 500 to 700° C. is carried out after forming a magnetic tunnel junction (MTJ) film, reliability of a device is highly possibly degraded due to, e.g., occurrence of interfacial diffusion of a contact and a substrate.

It is to be noted that the following documents of reference information of conventional technologies are present in relation to the present invention.

[Patent Document 1] JP-A 2003-282837 (KOKAI)
[Patent Document 2] JP-A 2003-133527 (KOKAI)
[Patent Document 3] Specification in U.S. Patent Application Laid-open No. 2006/0002184
[Patent Document 4] JP-A 2004-214459 (KOKAI)

BRIEF SUMMARY OF THE INVENTION

According to one aspect of the present invention, there is provided a magnetic random access memory which is a memory cell array comprising a magnetoresistive effect element having a fixed layer whose magnetization direction is fixed, a recording layer whose magnetization direction is reversible, and a non-magnetic layer provided between the fixed layer and the recording layer, wherein all conductive layers in the memory cell array arranged below the magnetoresistive effect element are formed of materials each containing an element selected from a group including W, Mo, Ta, Ti, Zr, Nb, Cr, Hf, V, Co, and Ni.

BRIEF DESCRIPTION OF THE SEVERAL VIEWS OF THE DRAWING

FIGS. 9A to 9D are views for explaining a magnetic random access memory write operation according to the sixth embodiment of the present invention;

FIGS. 12 and 13 are cross-sectional views showing a surrounding structure of a magnetic tunnel junction according to other embodiment of the present invention.

DETAILED DESCRIPTION OF THE INVENTION

Figure 1:
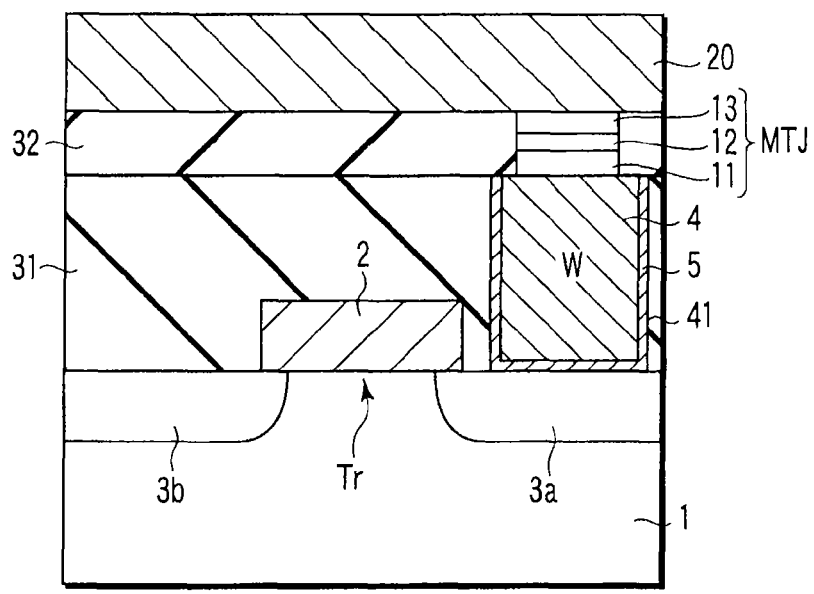
FIG. 1 is a cross-sectional view showing a magnetic random access memory according to a first embodiment of the present invention.

Embodiments according to the present invention will now be explained hereinafter with reference to the accompanying drawings. In this explanation, like reference numerals denote like parts throughout the drawings.

[1] First Embodiment

A first embodiment is an example where a contact and the like arranged below a magnetic tunnel junction (MTJ) element are formed of a material containing a refractory metal.

[1-1] Structure

FIG. 1 is a cross-sectional view showing a magnetic random access memory according to a first embodiment of the present invention. A structure of a memory cell in the magnetic random access memory according to the first embodiment will now be explained hereinafter.

As shown in FIG. 1, an element isolation region (not shown) having a shallow trench isolation (STI) structure is formed in a semiconductor substrate (a silicon substrate) 1. A gate electrode 2 is formed on the semiconductor substrate 1 through a gate insulating film (not shown), and source/drain diffusion layers 3a and 3b are formed in the semiconductor substrate 1 on both sides of this gate electrode 2, thereby forming a transistor (e.g., an MOS transistor) Tr functioning as a switching element.

A contact 4 is connected with the source/drain diffusion layer 3a of the transistor Tr, and a barrier metal film 5 is formed on a button surface and a side surface of this contact 4. An MTJ element MTJ is formed on the contact 4. Therefore, the contact 4 is arranged immediately below the MTJ element MTJ and directly connected with the MTJ element MTJ. The MTJ element MTJ has a laminated structure in which a fixed layer (a pin layer) 11, a non-magnetic layer 12, and a recording layer (a free layer) 13 are sequentially laminated. An interconnect 20 is connected with a top face of the MTJ element MTJ. This interconnect 20 is connected with, e.g., a power supply terminal and a ground terminal.

Here, although this drawing shows a structure of one memory cell, a plurality of memory cells are arranged in the magnetic random access memory to constitute a memory cell array.

Further, all conductive layers in the memory cell array placed below a bottom surface of the MTJ element MTJ are formed of materials each containing a refractory metal. For example, the conductive layer is a layer formed of a single metal element as a refractory metal, a layer formed of a compound containing a refractory metal, or a laminated layer including these layers. As the conductive layer formed of a refractory metal, there is, e.g., the contact 4, the barrier metal film 5, or the gate electrode 2.

It is to be noted that, when a salicide film of, e.g., TiSix, CoSix, or NiSix is formed on the source/drain diffusion layers 3a and 3b, this salicide film is also included in the conductive layer formed of a refractory metal.

Furthermore, when the conductive layer, e.g., a peripheral circuit is placed below the bottom surface of the MTJ element MTJ in the memory cell array, forming such the conductive layer by using a material containing a refractory metal is desirable.

[1-2] Material (Refractory Metal)

The refractory metal means a metal having a high melting point. As this refractory metal, there are, e.g., tungsten (W), molybdenum (Mo), tantalum (Ta), titanium (Ti), zirconium (Zr), niobium (Nb), chromium (Cr), hafnium (Hf), vanadium (V), cobalt (Co), nickel (Ni), and others. A group including such refractory metals will be referred to as a refractory metal group M hereinafter.

(Compounds Containing Refractory Metal)

As compounds each containing an element selected from the refractory metal group M, there are the following compounds.

(a) A compound containing Ti (e.g., TiN, TiW, TiSiN, $TiSi_x$, $TiB_2$, TiB, or TiC)

(b) A compound containing Ta (e.g., $TaB_2$, TaB, TaC, TaN, $Ta_4N_5$, $Ta_5N_6$, $Ta_2N$)

(c) A compound containing Zr (e.g., $ZrB_2$, ZrB, ZrC, or ZrN)

(d) A compound containing Hf (e.g., HfB, HfC, or HfN)

(e) A compound containing V (e.g., $VB_2$, VB, VC, or VN)

(f) A compound containing Nb (e.g., $NbB_2$, NbB, NbC, or NbN)

(g) A compound containing Cr (e.g., CrB2, CrB, $Cr_2B$, $Cr_3C_2$, $Cr_2N$, or CrN)

(h) A compound containing Mo (e.g., $Mo_2B_3$, $MoB_2$, MoB, $Mo_2B$, $Mo_xC_y$, $Mo_2C$, or MoN)

(i) A compound containing W (e.g., $W_xB_y$, $W_2B_5$, $W_xC_y$, WC, $W_2C$, $W_xN_y$, or WN)

(j) A compound containing Co (e.g., CoSix)

(k) A compound containing Ni (e.g., NiSix)

It is may be used RuOx instead of the compound.

(Material of Contact 4)

The contact 4 is formed of a material containing an element selected from the refractory metal group M. Therefore, for example, W or the like is desirable as the contact 4.

It is to be noted that a silicide layer may be laminated on the contact 4.

(Material of Barrier Metal Film 5)

The barrier metal film 5 is formed of a material containing an element selected from the refractory metal group M. Therefore, as the barrier metal film 5, Ti, Ta, a compound containing Ti (e.g., TiSix or TiN), a compound containing Ta (e.g., TaSix or TaN), or a laminated layer including these compounds (e.g., Ti/TiN) is desirable. It is to be noted that a silicide layer may be laminated on the barrier metal film 5.

(Material of Gate Electrode 2)

The gate electrode 2 is formed of a material containing an element selected from the refractory metal group M. Therefore, as the gate electrode 2, for example, a Poly-Si/NiSix, Poly-Si/WSix or Poly-Si/Wx/W laminated layer is desirable.

It is to be noted that a silicide layer may be laminated on the gate electrode 2.

[1-3] Write Operation

In the magnetic random access memory according to the first embodiment, data writing using spin injection magnetization reversal is executed. Therefore, in the MTJ element MTJ, magnetization directions of the fixed layer 11 and the recording layer 13 enter a parallel state or an anti-parallel state in accordance with a direction of a current I that is passed to a space between the fixed layer 11 and the recording layer 13. Specifically, the following states are realized.

When writing data "1", the current I is passed in a direction from the fixed layer 11 to the recording layer 13 in the MTJ element MTJ. That is, an electron e is injected to the fixed layer 11 side from the recording layer 13 side. As a result, magnetizations of the fixed layer 11 and the recording layer 13 have opposite directions, i.e., enter the anti-parallel state. This high-resistance state Rap is defined as data "1".

On the other hand, when writing data "0", the current I is passed in a direction from the recording layer 13 to the fixed layer 11 in the MTJ element MTJ. That is, the electron e is injected to the recording layer 13 side from the fixed layer 11 side. As a result, magnetizations of the fixed layer 11 and the recording layer 13 have the same direction, i.e., enter the parallel state. This low-resistance state Rp is defined as data "0".

[1-4] Read Operation

In a read operation of the magnetic random access memory according to the first embodiment of the present invention, the magnetoresistive effect is utilized.

The transistor Tr connected with the MTJ element MTJ in a selected cell is turned on, and a read current is passed in a direction of the transistor Tr from, e.g., the interconnect 20 through the MTJ element MTJ. Moreover, a judgment is made upon whether data is "1" or "0" based on the resistance of the MTJ element MTJ read based on this read current.

It is to be noted that, in the read operation, a constant voltage may be applied to read a current or a constant current may be applied to read a voltage.

[1-5] Effect

According to the first embodiment, all the conductive layers (e.g., the contact 4, the barrier metal film 5, the gate electrode 2, and others) below the MTJ element MTJ are formed of materials each containing a refractory metal. Therefore, even when high-temperature annealing is carried out after forming the film of the MTJ element MTJ, the refractory metal is thermally stable, and there is no problem in an interfacial state. Therefore, characteristics of the element can be suppressed from being degraded.

For example, when the barrier metal film 5 of Ti/TiN and the contact 4 of W are formed on the silicon substrate 11 to avoid an interface reaction, it is often the case that Ti alone in the barrier metal film 5 reacts with Si, thereby forming TiSi. Usually, an interface between Si and a TiSi/TiN/W structure has no problem and stable in a heat treatment at approximately 700° C. Therefore, even when the MTJ film is deposited on such a contact 4 and annealing is performed for the purpose of improving crystallinity, interfacial diffusion does not occur.

[2] Second Embodiment

A second embodiment is an example where an interconnect below the MTJ element in the first embodiment is also formed of a refractory metal. It is to be noted that, in the second embodiment, an explanation of the same points as those in the foregoing embodiment will be omitted.

[2-1] Structure

Figure 2:
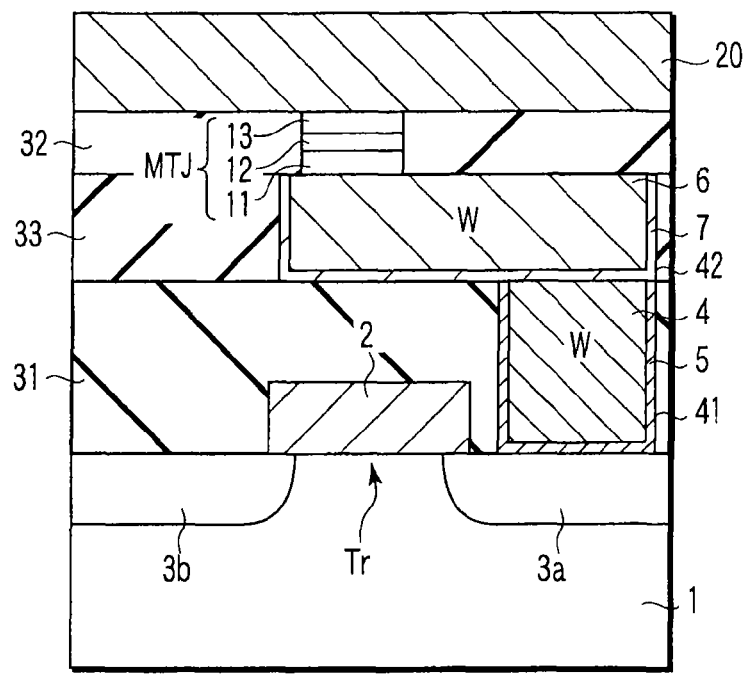
FIG. 2 is a cross-sectional view showing a magnetic random access memory according to a second embodiment of the present invention.

FIG. 2 is a cross-sectional view of a magnetic random access memory according to the second embodiment of the present invention. A structure of the magnetic random access memory according to the second embodiment will now be explained.

As shown in FIG. 2, the second embodiment is different from the first embodiment in that an interconnect 6 pulled out in a direction parallel to a substrate surface is formed on a contact 4, a barrier metal film 7 is formed on a side surface and a bottom surface of this interconnect 6, and an MTJ element MTJ is formed on the interconnect 6.

Therefore, the interconnect 6 is arranged immediately below the MTJ element MTJ, and a gate electrode 2 is arranged on a semiconductor substrate 11 below the MTJ element MTJ.

Here, the interconnect 6 is formed of, e.g., W, and the barrier metal film 7 is formed of TiN. W has a specific resistance which is as low as 5 μΩ·cm, and has been conventionally used as a bit line in a DRAM. The interconnect 6 is arranged because of its convenience in laying the interconnect in a cell or for the reason of utilizing a current magnetic field produced from the interconnect.

[2-2] Material

Each of the interconnect 6 and the barrier metal film 7 is formed of a material containing a metal selected from the refractory metal group M in the section [1-2].

Therefore, as the interconnect 6, for example, W or Ta is desirable.

Additionally, as the barrier metal film 7, Ti, Ta, a compound containing Ti (e.g., TiSix or TiN), a compound containing Ta (e.g., TaSix or TaN), and a laminated layer including these materials (e.g., Ti/TiN) is desirable.

It is to be noted that a silicide layer may be laminated on the interconnect 6 and the barrier metal film 7.

[2-3] Effect

According to the second embodiment, since a refractory metal material is used for each of the interconnect 6 and the barrier metal film 7 below the MTJ element MTJ, all conductive layers below the MTJ element MTJ are formed of a material containing a refractory metal like the first embodiment. Therefore, the second embodiment can obtain the same effect as that in the first embodiment.

[3] Third Embodiment

A third embodiment is an example where a lower electrode of the MTJ element in the first embodiment is likewise formed of a refractory metal. It is to be noted that, in the third embodiment, an explanation on the same points as those in each of the foregoing embodiments will be omitted.

[3-1] Structure

Figure 3:
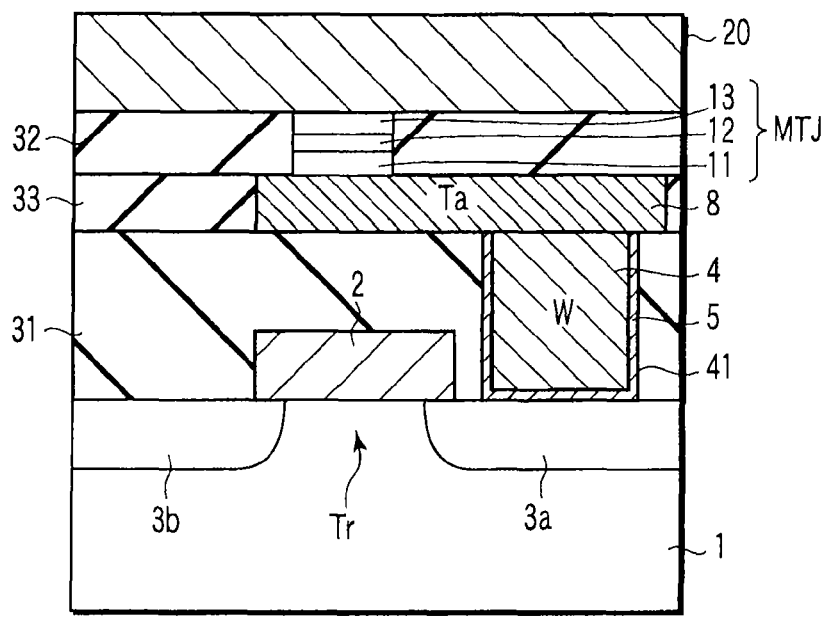
FIG. 3 is a cross-sectional view showing a magnetic random access memory according to a third embodiment of the present invention.

FIG. 3 is a cross-sectional view of a magnetic random access memory according to the third embodiment of the present invention. A structure of the magnetic random access memory according to the third embodiment will now be explained hereinafter.

As shown in FIG. 3, the third embodiment is different from the first embodiment in that a lower electrode 8 pulled out in a direction parallel to a substrate surface is formed on a contact 4 and an MTJ element MTJ is formed on this lower electrode 8.

Therefore, the lower electrode 8 is arranged directly below the MTJ element MTJ, and a gate electrode 2 is arranged on a semiconductor substrate 11 below the MTJ element MTJ.

[3-2] Material

The lower electrode 8 is formed of a material containing a metal selected from the refractory metal group M in the section [1-2]. Therefore, as the lower electrode 8, for example, Ta or W is desirable.

It is to be noted that a silicide layer may be laminated on the lower electrode 8.

[3-3] Effect

According to the third embodiment, since a refractory metal material is likewise used for the lower electrode 8 below the MTJ element MTJ, all conductive layers below the MTJ element MTJ are formed of materials each containing a refractory metal. Therefore, the third embodiment can obtain the same effect as that of the first embodiment.

[4] Fourth Embodiment

A fourth embodiment is an example where a contact on the MTJ element in the first embodiment is likewise formed of a refractory metal. It is to be noted that, in the fourth embodiment, an explanation on the same points as those in each of the foregoing embodiments will be omitted.

[4-1] Structure

Figure 4:
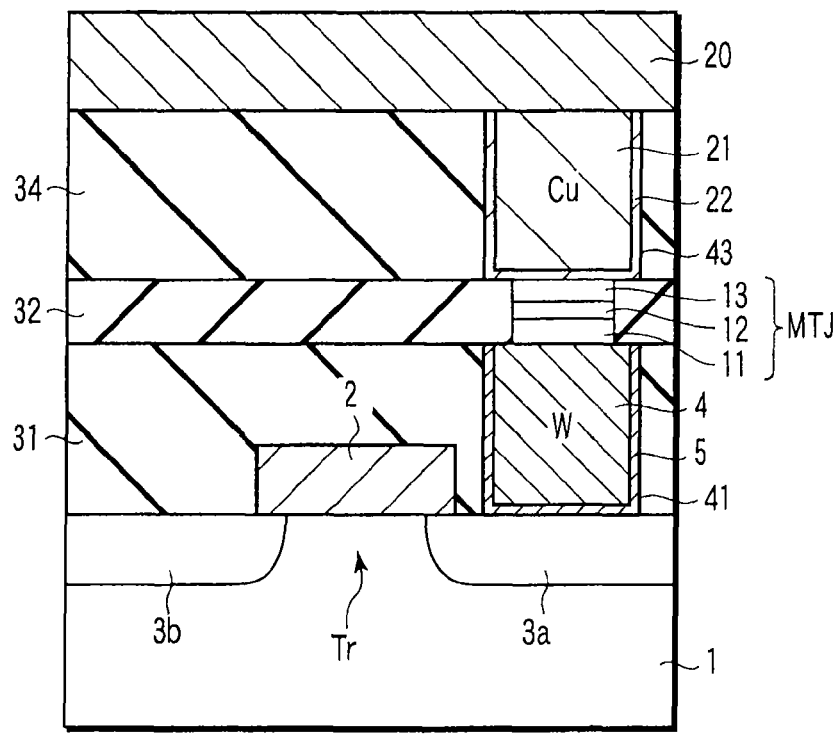
FIG. 4 is a cross-sectional view showing a magnetic random access memory according to a fourth embodiment of the present invention.

FIG. 4 is a cross-sectional view of a magnetic random access memory according to the fourth embodiment of the present invention. A structure of the magnetic random access memory according to the fourth embodiment will now be explained hereinafter.

As shown in FIG. 4, the fourth embodiment is different from the first embodiment in that a contact 21 is formed on an MTJ element MTJ, a barrier metal film 22 is formed on a side surface and a bottom surface of this contact 21, and an interconnect 20 is formed on the contact 21.

This contact 21 is placed immediately above the MTJ element MTJ and directly connected with the MTJ element MTJ.

[4-2] Material

The contact 21 on the MTJ element MTJ is formed of Cu or Al. A current general interconnect material, e.g., Cu or Al has a melting point lower than that of W and is thermally unstable. However, like each of the forgoing embodiments, a refractory metal film of, e.g., W alone is used for a contact 4, a barrier metal film 5, a gate electrode 2, and others below the MTJ element MTJ, and this structure is unstable to perform high-temperature annealing for the MTJ film. Therefore, even when an interconnect material, e.g., Al or Cu which is thermally unstable but has a low specific resistance is laminated on the MTJ element, the effect of this embodiment is not prevented.

However, the contact 21 may be formed of a material containing a metal selected from the refractory metal group M in the section [1-2] like the contact 4.

Further, the barrier metal film 22 may be formed of a material containing a metal selected from the refractory metal group M in the section [1-2] like the barrier metal film 5.

[4-3] Effect

According to the fourth embodiment, since all the conductive layers below the MTJ element MTJ are formed of materials each containing a refractory metal, the same effect as that of the first embodiment can be obtained.

[5] Fifth Embodiment

A fifth embodiment is a modification of the barrier metal film in each of the foregoing embodiment. It is to be noted that, in the fifth embodiment, an explanation on the same points as those in each of the foregoing embodiments will be omitted.

[5-1] Barrier Metal Film of Contact

EXAMPLE 1

Figure 5A:
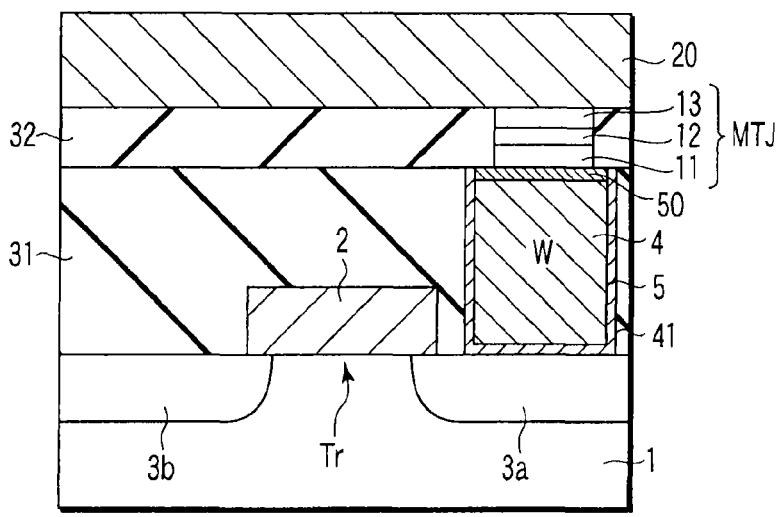
FIG. 5A is a cross-sectional view showing Example 1 of a barrier metal film of a contact according to a fifth embodiment of the present invention.

FIG. 5A is a cross-sectional view of Example 1 of a barrier metal film of a contact according to the fifth embodiment of the present invention. Example 1 of the barrier metal film of the contact according to the fifth embodiment will now be explained hereinafter.

As shown in FIG. 5A, a contact hole 41 is formed in an interlayer insulating film 31, and a barrier metal film 5 is formed on a side surface and a bottom surface of this contact hole 41. A top face of the barrier metal film 5 placed on the side surface of the contact hole 41 is positioned above a top face of the contact hole 4, and matches with a top face of the interlayer insulating film 31. The top face of the contact 4 is placed below the top face of the interlayer insulating film 31.

A barrier metal film 50 is formed on the top face of the contact 4. This barrier metal film 50 is formed on the top face of the contact 4 alone and buried in the contact hole 41. A top face of the barrier metal film 50 matches with the top face of the interlayer insulating film 31 and the top face of the barrier metal film 5, and a side surface of the barrier metal film 50 is in contact with a side surface of the barrier metal film 5.

Such a barrier metal film in Example 1 is formed as follows. First, the contact hole 41 is formed in the interlayer insulating film 31, and the barrier metal film 5 is formed in the contact hole 41 and on the interlayer insulating film 31. Furthermore, a contact material is formed on this barrier metal film 5. Subsequently, the barrier metal film 5 and the contact material are flattened by, e.g., CMP (Chemical Mechanical Polishing) until the interlayer insulating film 31 is exposed. As a result, the contact 4 and the barrier metal film 5 are formed in the contact hole 41. Then, an upper portion of the contact 4 is removed by, e.g., physical etching or wet etching using HCl. As a result, the top face of the contact 4 becomes lower than the top face of the interlayer insulating film 31, thereby forming a groove. At this time, the barrier metal film 5 is prevented from being removed. Then, the barrier metal film 50 is deposited in the groove and on the interlayer insulating film 31. Thereafter, the barrier metal film 50 is flattened by, e.g., CMP, thus exposing the interlayer insulating film 31. In this manner, the barrier metal shown in FIG. 5A is brought to completion.

EXAMPLE 2

Figure 5B:
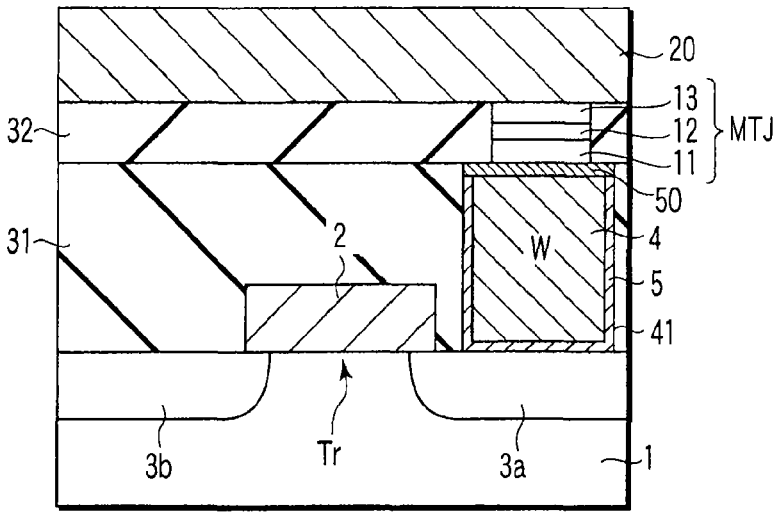
FIG. 5B is a cross-sectional view showing Example 2 of the barrier metal film of the contact according to the fifth embodiment of the present invention.

FIG. 5B is across-sectional view of Example 2 of the barrier metal film of the contact according to the fifth embodiment of the present invention. Example 2 of the barrier metal film of the contact according to the fifth embodiment will now be explained hereinafter.

As shown in FIG. 5B, a contact hole 41 is formed in an interlayer insulating film 31, and a barrier metal film 5 is formed on a side surface and a bottom surface of this contact hole 41. A top face of the barrier metal film 5 placed on the side surface of the contact hole 41 matches with a top face of a contact 4. The top face of the contact 4 and the top face of the barrier metal film 5 are placed below a top face of the interlayer insulating film 31.

A barrier metal film 50 is formed on the top face of the contact 4 and the top face of the barrier metal film 5. This barrier metal film 50 is buried in the contact hole 41. A top face of the barrier metal film 50 matches with the top face of the interlayer insulating film 31, and a side surface of the barrier metal film 50 is in contact with a side surface (the interlayer insulating film 31) of the contact hole 41.

Such a barrier metal film in Example 2 is formed as follows. First, the contact hole 41 is formed in the interlayer insulating film 31, and the barrier metal film 5 is formed in the contact hole 41 and on the interlayer insulating film 31. Moreover, a contact material is formed on this barrier metal film 5. Subsequently, the barrier metal film 5 and the contact material are flattened by, e.g., CMP until the interlayer insulating film 31 is exposed. As a result, the contact 4 and the barrier metal film 5 are formed in the contact hole 41. Then, upper portions of the contact 4 and the barrier metal film 5 are removed by, e.g., physical etching or wet etching using HCl. As a result, the top faces of the contact 4 and the barrier metal film 5 become lower than the top face of the interlayer insulating film 31, thereby forming a groove. Subsequently, the barrier metal film 50 is deposited in the groove and on the interlayer insulating film 31. Thereafter, the barrier metal film 50 is flattened by, e.g., CMP, thus exposing the interlayer insulating film 31. In this manner, the barrier metal depicted in FIG. 5B is brought to completion.

EXAMPLE 3

Figure 5C:
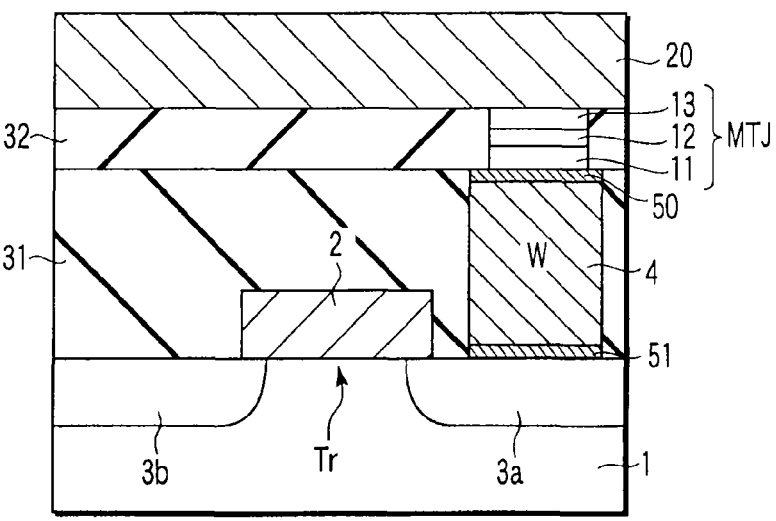
FIG. 5C is a cross-sectional view showing Example 3 of the barrier metal film of the contact according to the fifth embodiment of the present invention.

FIG. 5C is a cross-sectional view of Example 3 of the barrier metal film of the contact according to the fifth embodiment of the present invention. Example 3 of the barrier metal film of the contact according to the fifth embodiment will now be explained hereinafter.

As shown in FIG. 5C, a barrier metal film 50 is formed on a top face alone of a contact 4, and a barrier metal film 51 is formed on a bottom surface alone of the contact 4. A top face of the barrier metal film 50 matches with a top face of an interlayer insulating film 31. Side surfaces of the contact 4 and the barrier metal films 50 and 51 are all match with each other.

Such a barrier metal film in Example 3 is formed as follows. First, the barrier metal film 51, a contact material, and the barrier metal film 50 are sequentially laminated on a semiconductor substrate 11. Then, the barrier metal film 51, the contact material, and the barrier metal film 50 are processed by, e.g., reactive ion etching (RIE). As a result, the barrier metal films 50 and 51 are formed below and above the contact 4. In this manner, the barrier metal depicted in FIG. 5C is brought to completion.

In Examples 1 to 3, each of the barrier metal films 50 and 51 is formed of a material containing a metal selected from the refractory metal group M in the section [1-2].

In Examples 1 and 2, the barrier metal film 50 may be formed of the same material as that of the barrier metal film 5 or may be formed of a different material. When both the films are formed of the same material, there is an advantage that these films can be simultaneously formed in a process.

In Examples 1 and 2, film thicknesses of the barrier metal films 50 and 5 may be equal to or different from each other. However, it is desirable for the film thickness of the barrier metal film 50 to be larger than the film thickness of the barrier metal film 5 in order to protect the contact 4 when processing the MTJ element MTJ or absorb irregularities on the top face of the contact 4.

In Example 3, the barrier metal film 50 may be formed of a material that is equal to or different from a material of the barrier metal film 51. When both the films are formed of the same material, there is an advantage that these films can be readily formed in a process.

In Example 3, film thicknesses of the barrier metal films 50 and 51 may be equal to or different from each other. However, it is desirable for the film thickness of the barrier metal film 50 to be larger than the film thickness of the barrier metal film 51 in order to protect the contact 4 when processing the MTJ element MTJ or absorb irregularities on the top face of the contact 4.

[5-2] Barrier Metal Film of Interconnect

EXAMPLE 1

Figure 6A:
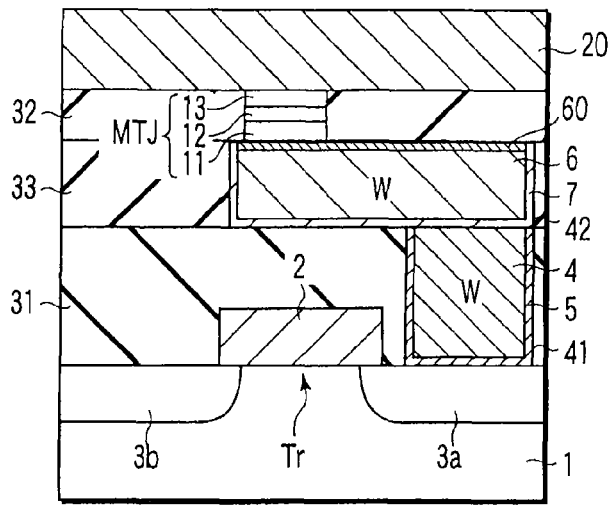
FIG. 6A is a cross-sectional view showing Example 1 of a barrier metal film of an interconnect according to the fifth embodiment of the present invention.

FIG. 6A is a cross-sectional view of Example 1 of a barrier metal film of an interconnect according to the fifth embodiment of the present invention. Example 1 of the barrier metal film of the interconnect according to the fifth embodiment will now be explained hereinafter. It is to be noted that the structure of the barrier metal film depicted in FIG. 5A is applied to the interconnect in this example, thereby omitting an explanation of a manufacturing method thereof.

As shown in FIG. 6A, a groove 42 is formed in an interlayer insulating film 33, and a barrier metal film 7 is formed on a side surface and a bottom surface of this groove 42. A top face of the barrier metal film 7 placed on the side surface of the groove 42 is positioned above a top face of an interconnect 6, and matches with a top face of the interlayer insulating film 33. A top face of the interconnect 6 is placed below the top face of the interlayer insulating film 33.

A barrier metal film 60 is formed on the top face of the interconnect 6. This barrier metal film 60 is formed on the top face of the interconnect 6 alone and buried in the groove 42. A top face of the barrier metal film 60 matches with the top face of the interlayer insulating film 33 and the top face of the barrier metal film 7, and a side surface of the barrier metal film 60 is in contact with a side surface of the barrier metal film 7.

EXAMPLE 2

Figure 6B:
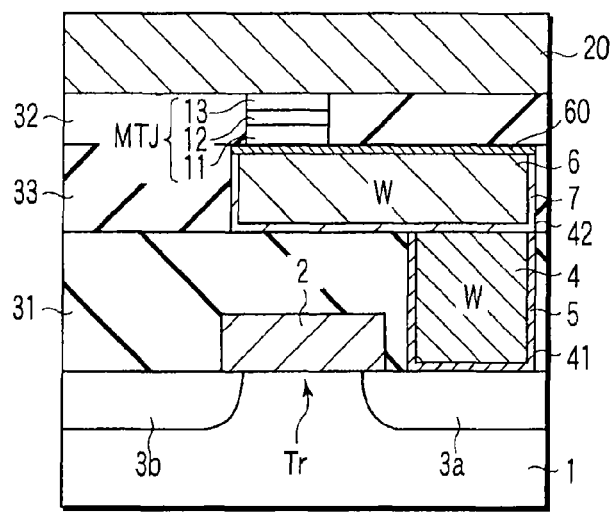
FIG. 6B is a cross-sectional view showing Example 2 of the barrier metal film of the interconnect according to the fifth embodiment of the present invention.

FIG. 6B is a cross-sectional view of Example 2 of the barrier metal film of the interconnect according to the fifth embodiment of the present invention. Example 2 of the barrier metal film of the interconnect according to the fifth embodiment will now be explained hereinafter. It is to be noted that the structure of the barrier metal film depicted in FIG. 5B is applied to the interconnect in this example, thereby omitting an explanation of a manufacturing method thereof.

As shown in FIG. 6B, a groove 42 is formed in an interlayer insulating film 31, and a barrier metal film 7 is formed on a side surface and a bottom surface of this groove 42. A top face of the barrier metal film 7 placed on the side surface of the groove 42 matches with a top face of an interconnect 6. The top face of the interconnect 6 and the top face of the barrier metal film 7 are placed below a top face of the interlayer insulating film 33.

A barrier metal film 60 is formed on the top face of the interconnect 6 and the top face of the barrier metal film 7. This barrier metal film 60 is buried in the groove 42. A top face of the barrier metal film 60 matches with the top face of the interlayer insulting film 33, and a side surface of the barrier metal film 60 is in contact with the side surface (the interlayer insulating film 33) of the groove 42.

EXAMPLE 3

Figure 6C:
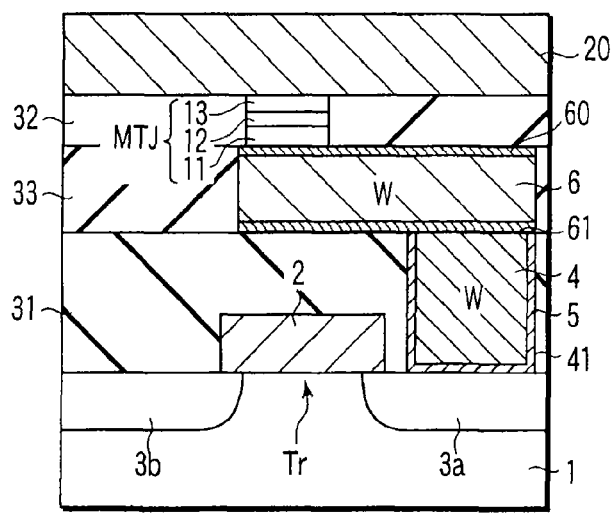
FIG. 6C is a cross-sectional view showing Example 3 of the barrier metal film of the interconnect according to the fifth embodiment of the present invention.

FIG. 6C is a cross-sectional view of Example 3 of a barrier metal film of an interconnect according to the fifth embodiment of the present invention. Example 3 of the barrier metal film of the interconnect according to the fifth embodiment will now be explained hereinafter. It is to be noted that the structure of the barrier metal film depicted in FIG. 5C is applied to an interconnect in this example, thereby omitting an explanation of a manufacturing method thereof.

As shown in FIG. 6C, a barrier metal film 60 is formed on a top face alone of an interconnect 6, and a barrier metal film 61 is formed on a bottom surface alone of the interconnect 6. A top face of the barrier metal film 60 matches with a top face of an interlayer insulating film 33. Side surfaces of the interconnect 6 and the barrier metal films 60 and 61 all match with each other.

In Examples 1 to 3, each of the barrier metal films 60 and 61 is formed of a material containing a metal selected from the refractory metal group M in the section [1-2].

In Examples 1 and 2, the barrier metal film 60 may be formed of a material equal to or different from a material of the barrier metal film 7. When both the films are formed of the same material, there is an advantage that these films can be simultaneously formed in a process.

In Examples 1 and 2, film thicknesses of the barrier metal films 60 and 7 may be equal to or different from each other. However, it is preferable for the film thickness of the barrier metal film 60 to be larger than the film thickness of the barrier metal film 7 in order to protect the interconnect 6 when processing the MTJ element MTJ or absorb irregularities on the top face of the interconnect 6.

In Example 3, the barrier metal film 60 may be formed of a material equal to or different from a material of the barrier metal film 61. When both the films are formed of the same material, there is an advantage that these films can be readily formed in a process.

In Example 3, film thicknesses of the barrier metal films 60 and 61 may be equal to or different from each other. However, it is desirable for the film thickness of the barrier metal film 60 to be larger than the film thickness of the barrier metal film 61 in order to protect the interconnect 6 when processing the MTJ element MTJ or absorb irregularities on the top face of the interconnect 6.

[5-3] Effect

According to the fifth embodiment, since all the conductive layers below the MTJ element MTJ are formed of materials each containing a refractory metal, the same effect as that of the first embodiment can be obtained.

[6] Sixth Embodiment

A sixth embodiment is an example where a contact area of each contact with respect to a recording layer is reduced to be smaller than an area of the recording layer by thinly forming the contacts above and below an MTJ element. It is to be noted that, in the sixth embodiment, an explanation on the same points as those in each of the foregoing embodiments will be omitted.

[6-1] Structure

Figure 7:
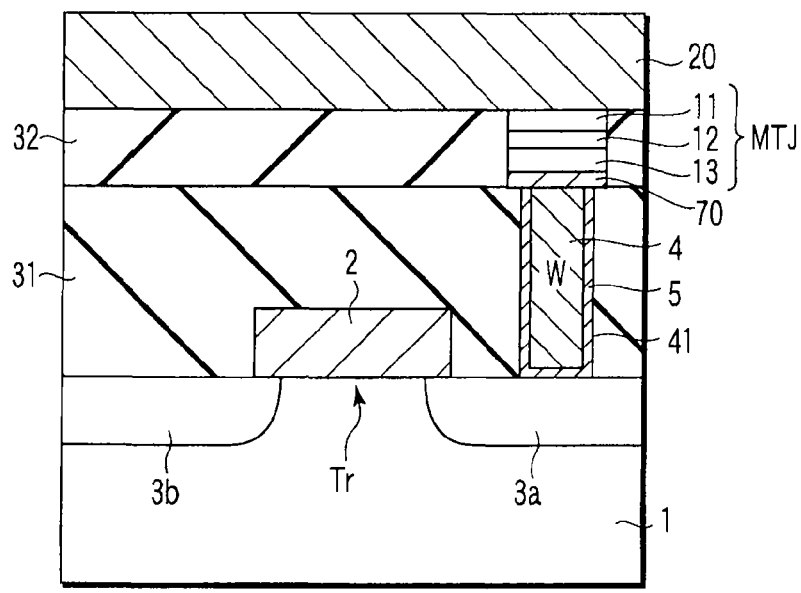
FIG. 7 is a cross-sectional view showing a small contact below an MTJ element according to a sixth embodiment of the present invention.
Figure 8:
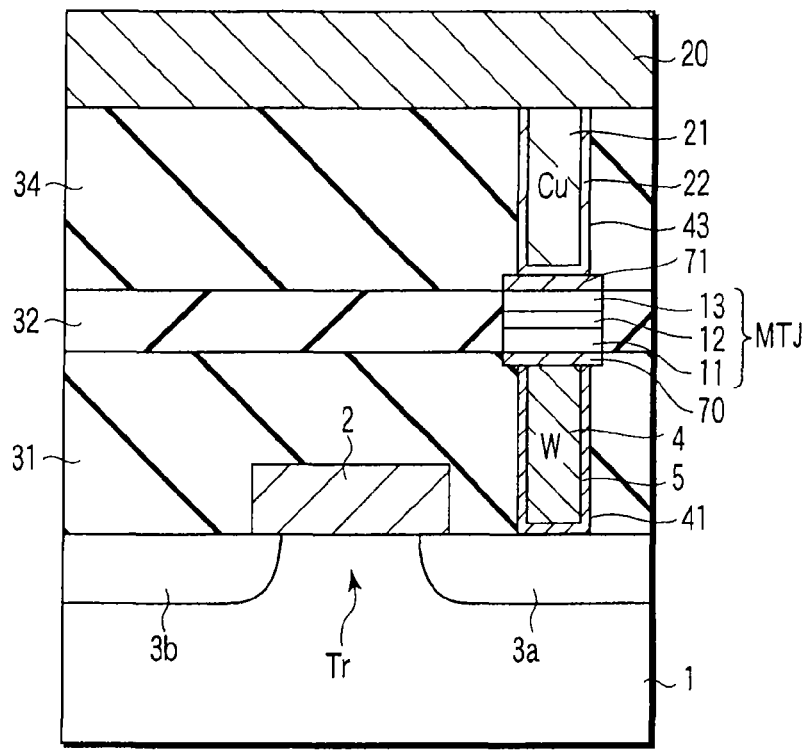
FIG. 8 is a cross-sectional view showing small contacts above and below the MTJ element according to the sixth embodiment of the present invention.

FIG. 7 is a cross-sectional view of a small contact below an MTJ element according to the sixth embodiment of the present invention. FIG. 8 is a cross-sectional view of small contacts above and below the MTJ element according to the sixth embodiment of the present invention. Each small contact in a magnetic random access memory according to the sixth embodiment will now be explained.

In the example depicted in FIG. 7, a contact 4 placed below an MTJ element MTJ is narrower than the MTJ element MTJ. Therefore, an area where the contact 4 is in contact with a recording layer 13 through a cap layer 70 is smaller than an area of the recording layer 13. The contact 4 is placed at, e.g., the center of the MTJ element MTJ (the recording layer 13).

In an example depicted in FIG. 8, each of contacts 4 and 21 placed above and below an MTJ element MTJ is narrower than the MTJ element MTJ. Therefore, an area where the contact 4 is in contact with a fixed layer 11 through a cap layer 70 is smaller than an area of the fixed layer 11. The contact 4 is placed at, e.g., the center of the MTJ element MTJ (the fixed layer 11). Further, an area where the contact 21 is in contact with a recording layer 13 through a cap layer 71 is smaller than an area of the recording layer 13. The contact 21 is placed at, e.g., the center of the MTJ element MTJ (the recording layer 13).

Here, it is desirable for the resistance of each of the cap layers 70 and 71 to be, e.g., approximately one digit higher than the resistance of the recording layer 13. As a material of each of the cap layers 70 and 71, there is, e.g., a material of a non-magnetic layer 12 or a barrier metal material having a large sheet resistance. Here, as to the material of the non-magnetic layer 12, please refer to a later-explained section [9-1]. As to the barrier metal material, please refer to the above-explained section [1-2]. It is to be noted that forming each of the cap layers 70 and 71 by using a material containing a metal selected from the refractory metal group M in the section [1-2] is desirable.

It is desirable for each of the cap layers 70 and 71 to have the same planar shape as the MTJ element MTJ in terms of process easiness, but it may have a different planar shape. It is desirable for an area of a bottom surface (a surface on the contact 4 side) of the cap layer 70 to be larger than an area of a top face (a surface on the cap layer 70 side) of the contact 4. It is desirable for an area of a top face (a surface on the contact 21 side) of the cap layer 71 to be larger than an area of a bottom surface (a surface on the cap layer 71 side) of the contact 21.

[6-2] Write Operation

FIGS. 9A to 9D are views for explaining a magnetic random access memory write operation according to the sixth embodiment of the present invention. A description will now be given on spin injection writing when a small contact according to the sixth embodiment is used. It is to be noted that an example where data "1" is to be written to the MTJ element MTJ having data "0" written therein will be explained.

First, as shown in FIG. 9A, it is assumed that magnetization of the recording layer 13 in the MTJ element MTJ has a downward direction, and magnetizations of the fixed layer 11 and the recording layer 13 are in a parallel state (a state of data "0"). Furthermore, as shown in FIG. 9B, when a write current I is passed in a direction from the fixed layer 11 to the recording layer 13, the magnetization of the recording layer 13 is first reversed only in a portion through which the write current I (an electron) passes (a portion with which the contact 4 is in contact). When the write current I is passed as it is, propagation due to current spin occurs in the recording layer 13 as sown in FIG. 9C, and the magnetization of the recording layer 13 sequentially starts reversal from the center toward the end of the recording layer 13. As a result, the magnetization of the recording layer 13 wholly has an upward direction as shown in FIG. 9D, and the magnetizations of the fixed layer 11 and the recording layer 13 enter an anti-parallel state (a state of data "1").

In such a write operation, when the contact 4 is processed to be small, a portion through which the write current I passes is a contact portion of the recording layer 13 and the contact 4 alone. Therefore, a low write current I can be set, and there is an advantage that a low current flowing through the transistor Tr can be set.

However, in order to realize this, it is desirable for a resistance of the cap layer 70 that is formed to protect the MTJ element MTJ to be sufficiently higher than that of the recording layer 13. When such a high-resistance cap layer 70 is not present, propagation of the electron to the cap layer 70 becomes faster than that to the recording layer 13, and hence the current I is not concentrated on the contact portion of the contact 4 and the recording layer 13 alone.

[6-3] Effect

According to the sixth embodiment, the same effect as that of the first embodiment can be obtained. Moreover, in the sixth embodiment, thinly forming each of the contacts 4 and 21 connected with the MTJ element MTJ enables reducing the area where each of the contacts 4 and 21 is in contact with the recording layer 13 to be smaller than an area of the recording layer 13. Therefore, in the write operation, magnetization reversal occurs from a local contact portion of each of the contacts 4 and 21 and the MTJ element MTJ, and propagation of the magnetization reversal due to a magnetic domain wall movement effect causes reversal of the magnetization of the entire element. Therefore, in the write operation, the write current can be reduced by the effect of the small contact. Additionally, providing each of the cap layers 70 and 71 having a higher resistance than that of the recording layer 13 enables avoiding a reduction in the effect due to current diffusion.

[7] Seventh Embodiment

A seventh embodiment is an example where a structure below the MTJ element MTJ in the first embodiment is formed into a multilayer. It is to be noted that, in the seventh embodiment, an explanation on the same points as those in each of the foregoing embodiments will be omitted.

[7-1] Structure

Figure 10:
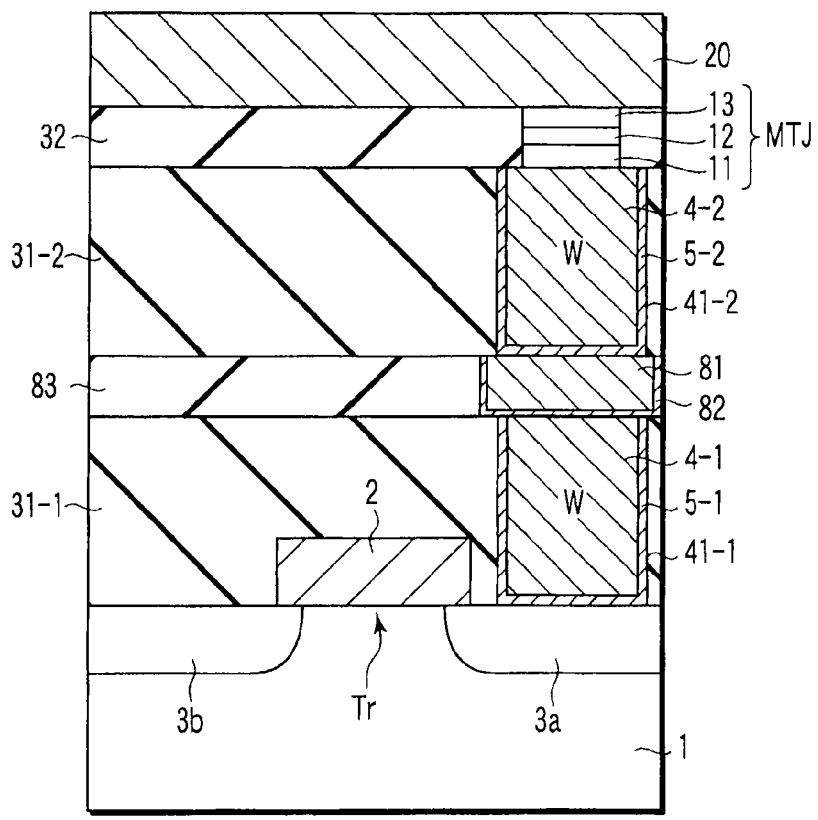
FIG. 10 is a cross-sectional view showing a magnetic random access memory having a multilayer structure according to a seventh embodiment of the present invention.

FIG. 10 is a cross-sectional view of a magnetic random access memory having a multilayer structure according to the seventh embodiment of the present invention. A structure of the magnetic random access memory according to the seventh embodiment will now be explained hereinafter.

As shown in FIG. 10, in the seventh embodiment, contacts and an interconnect have a multilayer structure as different from the first embodiment in which the one contact alone is formed below the MTJ element MTJ.

For example, a contact 4-1 is formed on a semiconductor substrate 11, and an interconnect 81 is formed on this contact 4-1. A contact 4-2 is further formed on this interconnect 81, and an MTJ element MTJ is formed on this contact 4-2. Barrier metal films 5-1, 82, and 5-2 are formed on side surfaces and bottom surfaces of the contact 4-1, the interconnect 81, and the contact 4-2, respectively.

Each of the contacts 4-1 and 4-2, the interconnect 81, and the barrier metal films 5-1, 82, and 5-2 is formed of a material containing a metal selected from the refractory metal group M in the section [1-2] like each of the foregoing embodiments. Therefore, even when the multilayer structure is provided below the MTJ element MTJ like this embodiment, all conductive layers below the MTJ element MTJ are formed of materials each containing a refractory metal.

It is to be noted that the example of the multilayer structure is not restricted to the structure depicted in FIG. 10, and the structure may include more layers, for example.

[7-2] Effect

According to the seventh embodiment, since all the conductive layers below the MTJ element MTJ are formed of materials each containing a refractory metal, the same effect as that of the first embodiment can be obtained.

[8] Eighth Embodiment

Although the example of the spin injection writing type memory cell has been explained in each of the foregoing embodiments, an example of a current magnetic field writing type memory cell will be explained in an eighth embodiment. It is to be noted that, in the eighth embodiment, an explanation of the same points as those in each of the foregoing embodiments will be omitted.

[8-1] Structure

Figure 11:
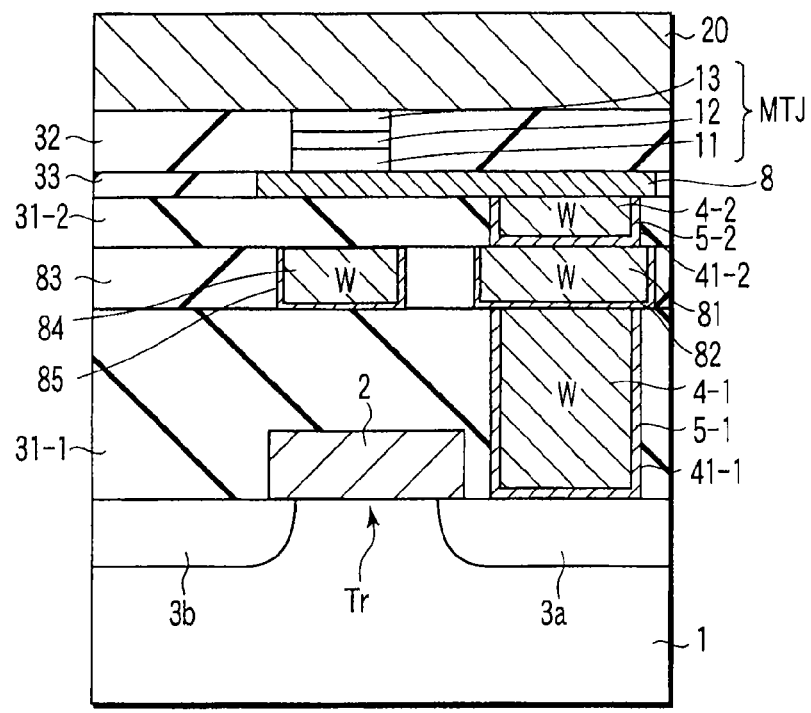
FIG. 11 is a cross-sectional view showing a current magnetic field writing type magnetic random access memory according to an eighth embodiment of the present invention.

FIG. 11 is a cross-sectional view of a current magnetic field writing type magnetic random access memory according to the eighth embodiment of the present invention. The current magnetic field writing type memory cell in a magnetic random access memory according to the eighth embodiment will now be explained.

As shown in FIG. 11, the eighth embodiment is different from the first embodiment in that a write interconnect 84 is arranged below an MTJ element MTJ.

Here, interconnects 20 and 84 are extended to cross each other, and an MTJ element MTJ is arranged in a region where the interconnects 20 and 84 cross each other. The MTJ element MTJ is connected with one interconnect 20 of the interconnects 20 and 84, but not connected with the other interconnect 84. The MTJ element MTJ is connected with a source/drain diffusion layer 3a through a lower electrode 8, a contact 4-2, an interconnect 81, and a contact 4-1. Barrier metal films 85, 5-2, 82, and 5-1 are formed on side surfaces and bottom surfaces of the interconnect 84, the contact 4-2, the interconnect 81, and the contact 4-1, respectively.

Each of the contacts 4-1 and 4-2, the interconnects 81 and 84, the lower electrode 8, and the barrier metal films 5-1, 5-2, 82, and 85 is formed of a material containing a metal selected from the refractory metal group M in the section [1-2] like each of the foregoing embodiments. Therefore, even in case of the current magnetic field writing type memory cell, all the conductive layers below the MTJ element MTJ are formed of materials each containing a refractory metal.

It is to be noted that positions of the interconnects 20 and 84 may be counterchanged. That is, the interconnect connected with the MTJ element MTJ can be arranged below the MTJ element MTJ, and the interconnect separated from the MTJ element MTJ can be arranged above the MTJ element MTJ.

[8-2] Write Operation

In current magnetic field writing, the interconnects 20 and 84 associated with selected cells are chosen, and a current is passed to these interconnects 20 and 84. Further, a combined magnetic field produced by this current is applied to the MTJ element MTJ. As a result, magnetization of a recording layer 13 in the MTJ element MTJ is reversed.

[8-3] Effect

According to the eighth embodiment, since all the conductive layers below the MTJ element MTJ are formed of materials each containing a refractory metal, the same effect as that of the first embodiment can be obtained.

[9] Ninth Embodiment

In a ninth embodiment, an MTJ element used in each of the foregoing embodiments will be explained.

[9-1] Material

An MTJ element MTJ is formed of the following material, for example.

As a material of each of a fixed layer 11 and a recording layer, it is preferable to use, e.g., Fe, Co, Ni, or an alloy of these materials, an oxide such as a magnetite, $CrO_2$, or $RXMnO_{3-y}$ (R; a rare earth, X; Ca, Ba, Sr) having a large spin polarizability, or a Heusler alloy such as NiMnSb or PtMnSb. Further, each of these magnetic materials may contain a certain amount of a non-magnetic element, e.g., Ag, Cu, Au, Al, Mg, Si, Bi, Ta, B, C, O, N, Pd, Pt, Zr, Ir, W, Mo, or Nb as long as ferromagnetism is not lost.

As a material of a non-magnetic layer 12, it is possible to use various dielectric materials, e.g., $Al_2O_3$, $SiO_2$, MgO, AlN, $Bi_2O_3$, MgF2, $CaF_2$, $SrTiO_2$, or $AlLaO_3$. Each of these dielectric materials may have a deficit of oxygen, nitrogen, or fluorine.

It is to be noted that MgO is desirable for the non-magnetic layer 12 in the MTJ element MTJ used in the spin injection type. Performing a heat treatment at 350° C. or above with respect to this MgO and magnetic films provided above and below MgO enables improving crystallinity. As a result, a filtering effect of spin of an electron to be injected is produced, thereby increasing an injection efficiency for reversal in the recording layer 13.

An antiferromagnetic layer that secures a magnetization direction of the fixed layer 11 may be provided on a surface of the fixed layer 11 on the opposite side of the non-magnetic layer 12. As a material of this antiferromagnetic layer, using, e.g., Fe—Mn, Pt—Mn, Pt—Cr—Mn, Ni—Mn, Ir—Mn, NiO, or $Fe_2O_3$ is preferable.

[9-2] Parallel Magnetization Type/Perpendicular Magnetization Type

Magnetization directions of the fixed layer 11 and the recording layer 13 in the MTJ element MTJ may be parallel to a film surface (a parallel magnetization type) or perpendicular to the film surface (a perpendicular magnetization type).

As examples of a perpendicular magnetic material, there are the following materials.

First, a magnetic material with a high coercive force that is used as a perpendicular magnetic material of each of the fixed layer 11 and the recording layer 13 is constituted of a material having a high anisotropy energy equal to or above $1 \times 10^6$ erg/cc or above. Examples of such materials will now be explained hereinafter.

EXAMPLE 1

"A material formed of an alloy including at least one of iron (Fe), cobalt (Co), and nickel (Ni) and at least one of chromium (Cr), platinum (Pt), and palladium (Pd)".

For example, as an ordered alloy, there is, e.g., Fe (50) Pt (50), Fe (50) Pd (50), or Co (50) Pt (50). For example, as a disordered alloy, there is, e.g., a CoCr alloy, a CoPt alloy, a CoCrPt alloy, a CoCrPtTa alloy, or CoCrNb alloy.

EXAMPLE 2

"A material having a structure in which at least one of Fe, Co, and Ni or an alloy including at least one of these materials and one of Pd and Pt or an alloy including one of these materials are alternately laminated".

For example, there is, e.g., a Co/Pt artificial lattice, a Co/Pd artificial lattice, or a CoCr/Pt artificial lattice. When the Co/Pt artificial lattice is used or when the Co/Pd artificial lattice is used, a large rate of change in a resistance (an MR ratio), i.e., approximately 40% can be realized.

EXAMPLE 3

"An amorphous alloy formed of at least one of rare-earth metals, e.g., terbium (Tb), dysprosium (Dy), or gadolinium (Dd) and at least one of transition metals".

For example, there is, e.g., TbFe, TbCo, TbFeCo, DyTb-FeCo, or GdTbCo.

Furthermore, the recording layer 13 may be formed of the above-explained magnetic material having a high coercive force or a magnetic material which has an anisotropy energy density lowered to be smaller than that of the magnetic material having a high coercive force by adjusting a composition ratio, adding an impurity, or adjusting a thickness. Examples of such materials will now be explained hereinafter.

EXAMPLE 1

"A material obtained by adding an impurity to an alloy containing at least one of Fe, Co, and Ni and at least one of Cr, Pt, and Pd".

For example, as an ordered alloy, there is a material whose anisotropy energy density is lowered by adding an impurity, e.g., Cu, Cr, or Ag to Fe (50) Pt (50), Fe (50) Pd (50), or Co (50) Pt (50). For example, as a disordered alloy, there is a material whose anisotropy energy density is lowered by increasing a percentage of a non-magnetic element in a CoCr alloy, a CoPt alloy, a CoCrPt alloy, a CoCrPtTa alloy, or a CoCrNb alloy.

EXAMPLE 2

"A material having a structure in which at least one of Fe, Co, and Ni or an alloy containing at least one of these materials and at least one of Pd and Pt or an alloy containing one of these material are alternately laminated and in which a thickness of a layer formed of the former element or alloy or a thickness of a layer formed of the latter element or alloy is adjusted".

There are an optimum thickness of at least one of Fe, Co, and Ni or an alloy containing at least one of these materials and an optimum thickness of one of Pd and Pt or an alloy containing one of these materials, and an anisotropy energy density is gradually reduced when each thickness becomes far from such an optimum thickness.

EXAMPLE 3

"A material obtained by adjusting a composition ratio of an amorphous alloy formed of at least one of rare-earth metals, e.g., terbium (Tb), dysprosium (Dy), or gadolinium (Gd) and at least one of the transition metals".

For example, there is a material whose anisotropy energy density is reduced by adjusting a composition ratio of an amorphous alloy, e.g., TbFe, TbCo, TbFeCo, DyTbFeCo, or DdTbCo.

It is to be noted that, when the above-explained perpendicular magnetic material is used, regularization or crystallinity is improved by a heat treatment at approximately 500° C., and an improvement in characteristics, e.g., enhancing a coercive force occurs.

[9-3] Planar Shape

A planar shape of the MTJ element MTJ can be changed into many shapes, e.g., a rectangular shape, a square shape, an elliptic shape, a circular shape, a hexagonal shape, a rhombic shape, a parallelogram shape, a cross shape, a bean-like shape (a concave shape), and others.

In case of a parallel magnetization type MTJ element MTJ, a magnetization direction has a shape anisotropy. Therefore, for example, when a direction of a narrow side (a direction of an axis along which magnetization is difficult) of the MTJ element MTJ is determined as F (a minimum processing dimension), a shape in which a longitudinal direction (a direction of an axis along which magnetization is easy) is approximately 2F is desirable.

In case of a perpendicular magnetization type MTJ element MTJ, since a magnetization direction is not dependent on a shape, any one of the above-explained shapes can be used.

[9-4] Tunnel Junction Structure

The MTJ element MTJ may have a single tunnel junction (a single junction) structure or a double tunnel junction (a double junction) structure.

As shown in FIG. 1 and others, an MTJ element MTJ in a single tunnel junction structure has a fixed layer 11, a recording layer 13, and a non-magnetic layer 12 provided between the fixed layer 11 and the recording layer 13. That is, the MTJ element MTJ has the single non-magnetic layer.

An MTJ element MTJ in a double tunnel junction structure has a first fixed layer, a second fixed layer, a recording layer provided between the first and second fixed layers, a first non-magnetic layer provided between the first fixed layer and the recording layer, and a second non-magnetic layer provided between the second fixed layer and the recording layer. That is, the MTJ element MTJ has the two non-magnetic layers.

In case of the double tunnel junction structure, the magnetoresistive (MR) ratio (ratio of change in resistance between the "1" state and the "0" state) when the same external bias is applied is less degraded and an operation can be performed with a higher bias as compared with the single tunnel junction structure. That is, the double tunnel junction structure is advantageous when reading information in a cell.

[10] Other

As shown in FIG. 12, in each of the foregoing embodiments, it is to be noted that a layer 90 may be formed adjacent to the fixed layer 11 or the recording layer 13. The crystallinity of the magnetic layer having the fixed layer 11 and the recording layer 13 is improved in the layer 90. The layer 90 has a CoFeB layer 91, an MgO layer 92 and a TiN or VN layer 93. For example, a film thickness of the CoFeB layer 91 is 5 nm, a film thickness of the MgO layer 92 is 1 nm, a film thickness of the TiN or VN layer 93 is 10 to 20 nm. The TiN or VN layer 93, the MgO layer 92 and the CoFeB layer 91 are laminated in turn from the fixed layer 11 or the recording layer 13.

As shown in FIG. 13, in each of the foregoing embodiments, it is to be noted that layers 90 may be formed adjacent to both the fixed layer 11 and the recording layer 13.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising a memory cell array, the memory cell array comprising:
a magnetoresistive effect element having a fixed layer whose magnetization direction is fixed, a recording layer whose magnetization direction is reversible, and a nonmagnetic layer provided between the fixed layer and the recording layer;

a contact plug which only extends vertically being placed immediately below the magnetoresistive effect element and being connected with the magnetoresistive effect element;

a first barrier metal film being formed on a side surface and a bottom surface of the contact plug; and a second barrier metal film being formed on a top surface of and directly contacting the contact plug and a top surface of the first barrier metal film and having a side surface that is flush with a side surface of the first barrier metal film, wherein all conductive layers in the memory cell array arranged below the magnetoresistive effect element are formed of materials each containing an element selected from a group including W, Mo, Ta, Ti, Zr, Nb, Cr, Hf, V, Co, and Ni, the all conductive layers include the contact plug, the first and second barrier metal films; and wherein a film thickness of the first barrier metal film is larger than a film thickness of the second barrier metal film.

2. The memory according to claim 1, wherein a material of the first barrier metal film is the same as a material of the second barrier metal film.

3. The memory according to claim 1, wherein the contact plug is connected with the recording layer via the first barrier metal film, a contact area of the contact plug with respect to the recording layer is smaller than an area of the recording layer.

4. The memory according to claim 3, further comprising:

a cap layer being formed between the recording layer and the first barrier metal film and having a resistance higher than a resistance of the recording layer.

5. The memory according to claim 4, wherein an area of a bottom surface of the cap layer is larger than an area of the top surface of the contact plug.

* * * * *